US012072500B2

(12) United States Patent
Liu et al.

(10) Patent No.: US 12,072,500 B2
(45) Date of Patent: Aug. 27, 2024

(54) OPTICAL DEVICE WITH ADDRESSABLE VCSEL ARRAYS

(71) Applicant: Lemon Inc., Grand Cayman (KY)

(72) Inventors: Runyu Liu, Los Angeles, CA (US); Bowei Zhang, Los Angeles, CA (US)

(73) Assignee: Lemon Inc., Grand Cayman (KY)

( * ) Notice: Subject to any disclaimer, the term of this patent is extended or adjusted under 35 U.S.C. 154(b) by 0 days.

(21) Appl. No.: 18/153,970

(22) Filed: Jan. 12, 2023

(65) Prior Publication Data
US 2024/0241377 A1    Jul. 18, 2024

(51) Int. Cl.
*G02B 27/01* (2006.01)
*G02B 27/00* (2006.01)
*G02B 27/09* (2006.01)
*H01S 5/42* (2006.01)

(52) U.S. Cl.
CPC ..... *G02B 27/0172* (2013.01); *G02B 27/0093* (2013.01); *G02B 27/0961* (2013.01); *H01S 5/423* (2013.01)

(58) Field of Classification Search
CPC ............ G02B 27/0172; G02B 27/0093; G02B 27/0961; H01S 5/423
See application file for complete search history.

(56) References Cited

U.S. PATENT DOCUMENTS

| | | | | |
|---|---|---|---|---|
| 5,325,386 A | * | 6/1994 | Jewell | H01S 5/423 372/45.01 |
| 8,551,150 B1 | * | 10/2013 | Webb | A61N 5/0603 607/88 |
| 10,244,181 B2 | * | 3/2019 | Warren | H04N 23/56 |
| 10,268,268 B1 | | 4/2019 | Trail | |
| 11,598,862 B2 | * | 3/2023 | Henderson | G01S 7/4863 |
| 2013/0169683 A1 | | 7/2013 | Perez et al. | |
| 2015/0340841 A1 | * | 11/2015 | Joseph | H01S 5/04257 372/50.12 |
| 2016/0164261 A1 | * | 6/2016 | Warren | H04N 23/11 372/50.122 |
| 2018/0203231 A1 | * | 7/2018 | Glik | G02B 27/0081 |
| 2020/0153203 A1 | | 5/2020 | Hatzilias et al. | |

(Continued)

FOREIGN PATENT DOCUMENTS

WO    2022088128 A1    5/2022

OTHER PUBLICATIONS

ISA Intellectual Property Office of Singapore, International Search Report Issued in Application No. PCT/SG2023/050804, Apr. 29, 2024, WIPO, 5 pages.

*Primary Examiner* — Darlene M Ritchie
(74) *Attorney, Agent, or Firm* — Alleman Hall & Tuttle LLP (57) ABSTRACT

An optical device is provided, including a body formed to have a concavity within which an eye box region is defined; and a plurality of addressable vertical cavity surface emitting laser (VCSEL) arrays arranged in the body of the optical device. The one or more VCSEL arrays comprise a plurality of VCSEL subarrays including independently addressable first and second VCSEL subarrays, which are controlled so as to power the first VCSEL subarray and not the second VCSEL subarray to illuminate only a first subregion of the eye box region, or to power the second VCSEL subarray and not the first VCSEL subarray to only illuminate a second subregion of the eye box region.

19 Claims, 6 Drawing Sheets

(56) References Cited

U.S. PATENT DOCUMENTS

| | | | |
|---|---|---|---|
| 2020/0386989 A1* | 12/2020 | Hatzilias | G02B 27/0093 |
| 2021/0106219 A1* | 4/2021 | Gibson | A61B 3/113 |
| 2022/0069546 A1* | 3/2022 | Roucka | H01S 5/18388 |
| 2022/0265140 A1* | 8/2022 | Oggenfuss | A61B 3/1005 |
| 2022/0317438 A1* | 10/2022 | Diaz | G02B 1/002 |
| 2023/0316972 A1* | 10/2023 | Shu | G02B 26/101 |
| | | | 345/697 |
| 2023/0400704 A1* | 12/2023 | Mirabella | G02B 27/0172 |

\* cited by examiner

FIG. 1

(PRIOR ART)

OPTICAL DEVICE WITH ADDRESSABLE VCSEL ARRAYS

BACKGROUND

The eye-tracking performance of optical devices such as head-mounted displays is aided by infrared illumination, which induces eye glints that are tracked by eye-tracking sensors as the eye moves. Light emitting diodes (LED) or laser light sources are often used to illuminate with infrared light a volume of three-dimensional space in which a user's eyes may be positioned while being tracked. This three dimensional space can be referred to as an eye box region. Differences in facial structure among users results in a wide variety of different positions of the eyes of users within the eye box region during tracking when wearing a head mounted display, for example. Conventionally, LEDs or laser light sources in such devices are configured to produce an illumination pattern with sufficient optical power and high uniformity across the entire three dimensional eye box region, to ensure that the iris, pupil, and cornea are adequately illuminated for a sufficiently high percentage of users in the user population. However, illuminating the entire eye box region also wastes power, since illumination is provided even in areas where the iris, pupil, and cornea are not located. This can result in shorter battery life for battery powered optical devices, and an undesirable increase in heat generation.

SUMMARY

In view of the above, an optical device is provided, including a body formed to have a concavity within which an eye box region is defined, and one or more vertical cavity surface emitting laser (VCSEL) arrays arranged in the body of the optical device. The one or more VCSEL arrays comprise a plurality of VCSEL subarrays including a first VCSEL subarray and a second VCSEL subarray, the first and second VCSEL subarrays being independently addressable. The optical device further includes processing circuitry configured to control the independently addressable first and second VCSEL subarrays in a power saving mode to power the first VCSEL subarray and not the second VCSEL subarray to illuminate only a first subregion of the eye box region, or to power the second VCSEL subarray and not the first VCSEL subarray to only illuminate a second subregion of the eye box region.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

In view of the above issues, the present disclosure describes a device and method for dynamically adjusting illumination regions of an illumination light source of an optical device in accordance with an eye relief of an individual user, thereby increasing energy efficiency and reducing power consumption while still providing adequate illumination to the corneal surface of the eye for potential applications including eye tracking systems. Such a device and method are described below in further detail.

Figure 1:
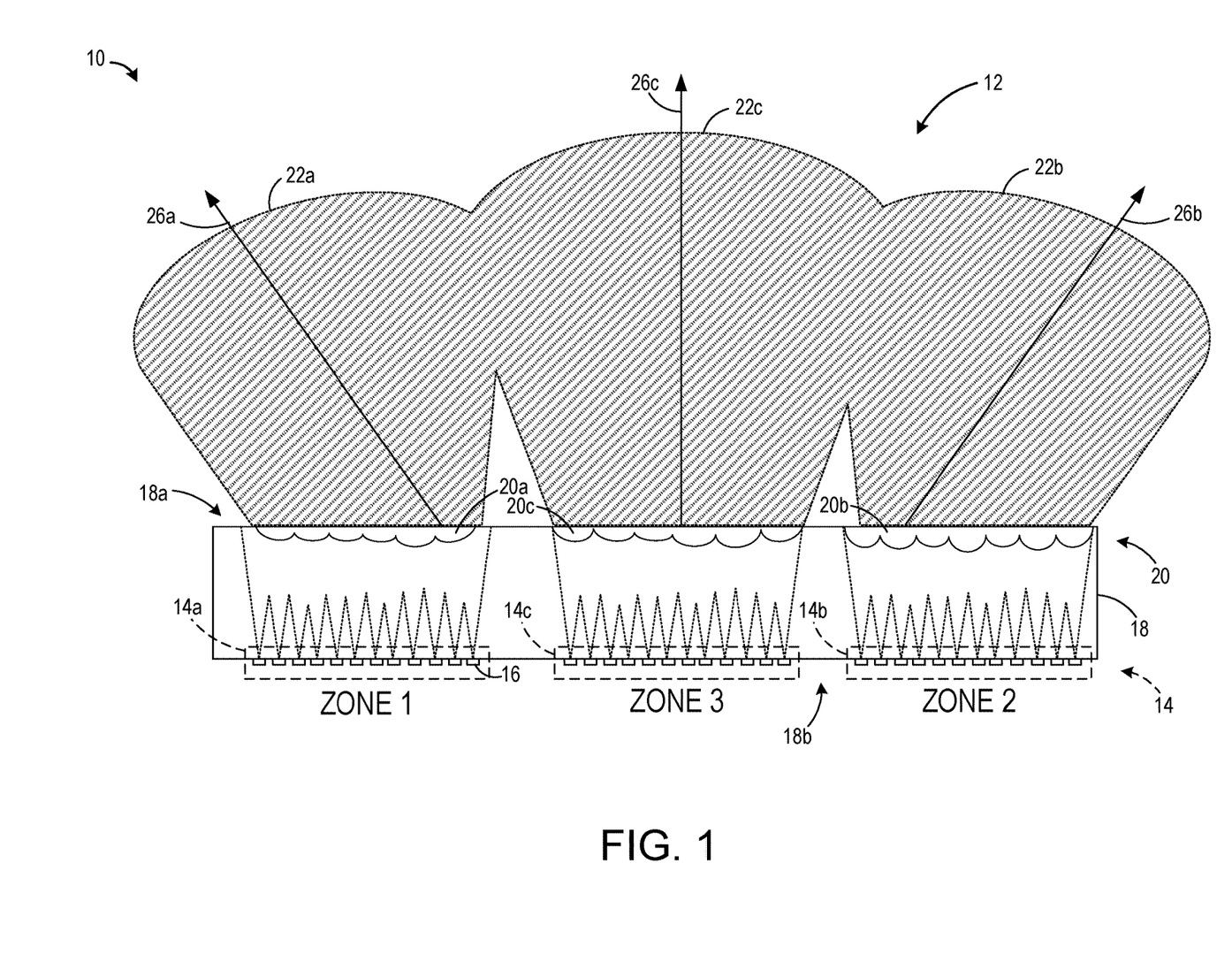
FIG. 1 illustrates an addressable Vertical-Cavity Surface-Emitting Laser (VCSEL) array of an optical device according to an example of the present disclosure.

To address these issues, FIG. 1 depicts an example addressable Vertical-Cavity Surface-Emitting Laser (VCSEL) array 12 of an optical device 10, comprising a backside substrate 18, a plurality of VCSEL subarrays 14 arranged on the backside substrate 18, and a microlens array 20. The plurality of VCSEL subarrays 14 are configured to emit infrared light when powered. A diffuser is not included or combined with the VCSEL array 12. The backside substrate 18 includes Gallium Arsenide (GaAs). However, it will be appreciated that other materials such as Indium Phosphide (InP), Indium Arsenide (InAs), Silicon (Si), an epitaxially grown material, and the like, may be used to form the backside substrate 18, which may include a DBR (Distributed Bragg Reflector) layer (not illustrated). The microlens array 20 is etched on a first surface 18a of the backside substrate 18 as a backside integrated lenslet array, and the plurality of VCSEL subarrays 14 are arranged on a second surface 18b of the backside substrate 18 opposite the first surface 18a. Thus, the microlens array 20 and the plurality of VCSEL subarrays 14 are monolithically integrated on the backside substrate 18. Lenslets 20a-c of the microlens array 20 are pseudo-randomized in shape, size, and curvature.

In this example, the plurality of VCSEL subarrays 14 comprise VCSEL subarrays 14a-c. Each VCSEL subarray 14a-c has a plurality of emitters 16 aligned with a corresponding microlens array 20. In this example, the first VCSEL subarray 14a is aligned with a first lenslet 20a, the second VCSEL subarray 14b is aligned with a second lenslet 20b, and the third VCSEL subarray 14c is aligned with a third lenslet 20c. When powered, each emitter 16 is configured to emits infrared light illuminating the backside of the optical device 10 as illustrated by the dotted lines. There may be any number of emitters 16 in each VCSEL subarray 14a-c, including twelve as depicted in FIG. 1.

Figure 3:
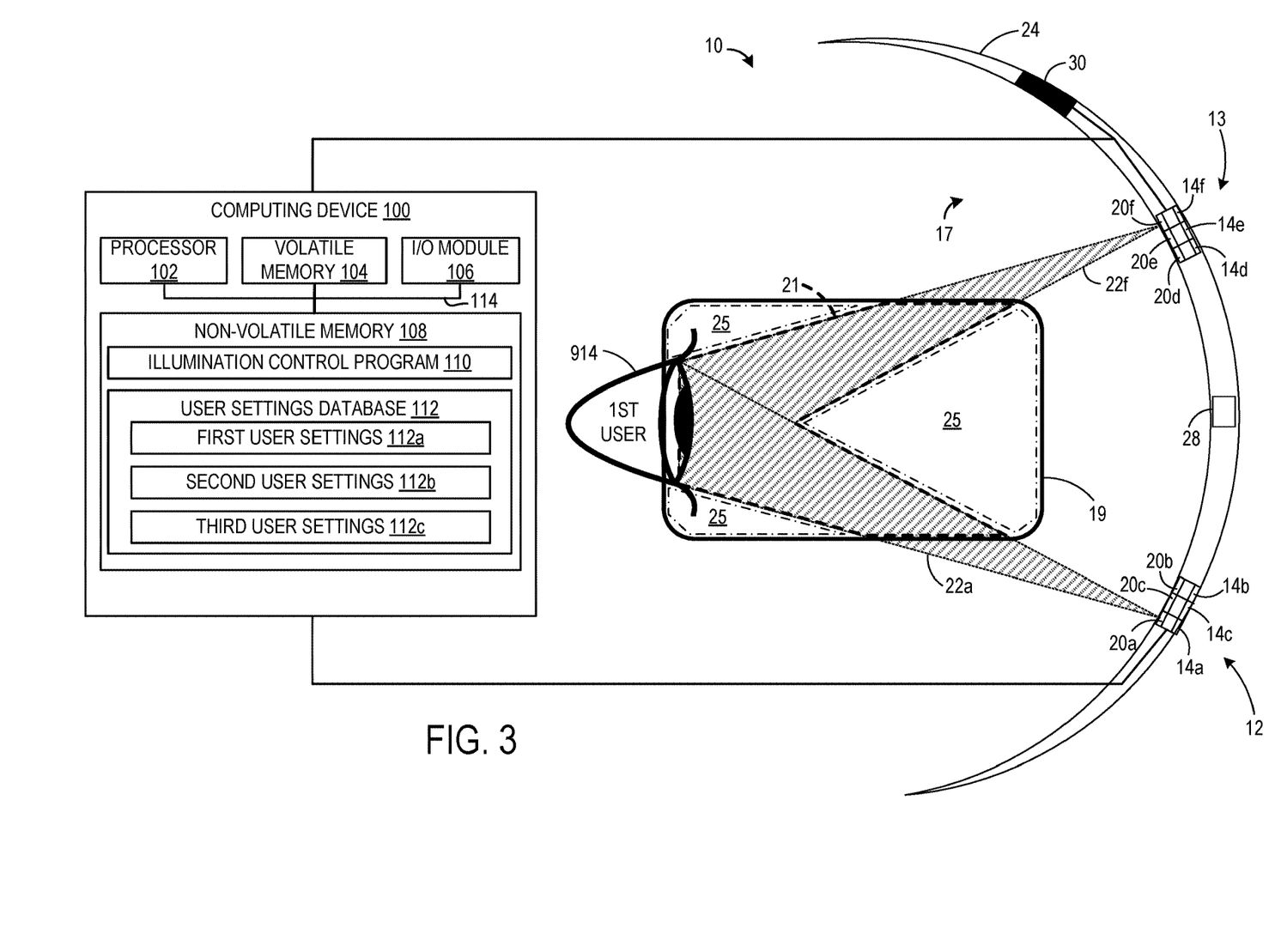
FIG. 3 illustrates an optical device in the form of a head-mounted display incorporating the VCSEL array of FIG. 1 according to an example of the present disclosure, in which the illumination angles of the VCSEL subarrays of the optical device are dynamically adjusted in accordance with an eye relief of a first user.
Figure 4:
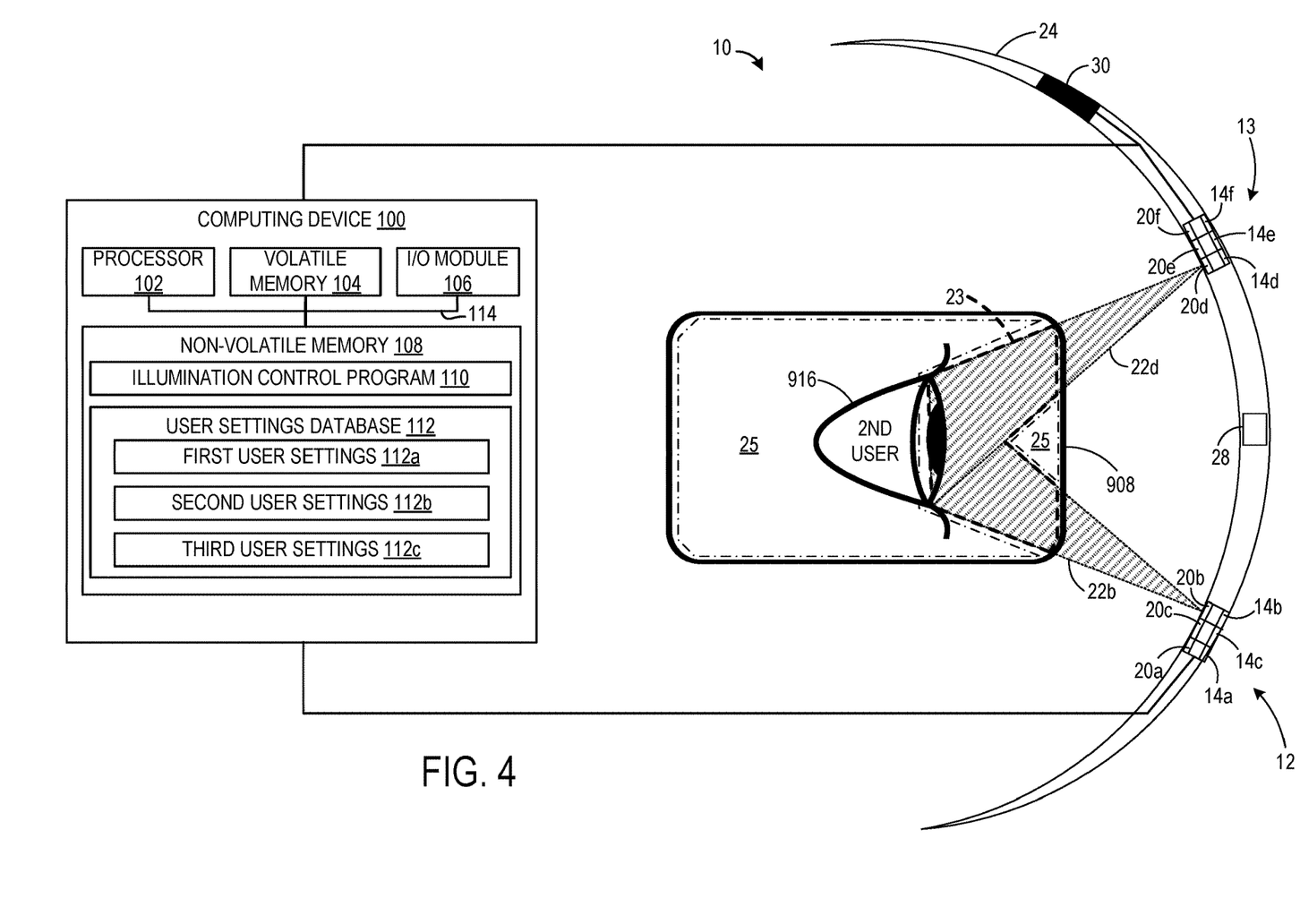
FIG. 4 illustrates the optical device of FIG. 3, in which the illumination angles of the VCSEL subarrays of the optical device are dynamically adjusted in accordance with an eye relief of a second user.

Each VCSEL subarray 14a-c defines a different zone pointing the emitted light in different directions. Different zones may have different lens curvature distributions within each lenslet 20a-c, so that illumination angle can be varied by design. As each of the plurality of lenslets 20a-c has a different radius of curvature or segmentation angle, each of the plurality of lenslets 20a-c directs an illumination cone of an emitted light in a different direction, to thereby illuminate a corresponding subregion of the eye box region 19 as shown in FIGS. 3 and 4 and discussed below. In this example, the first VCSEL subarray 14a belongs to Zone 1, emitting the infrared light to the first lenslet 20a, which has a radius of curvature or segmentation angle that points a first illumination cone 22a of the emitted light in a first direction 26a which is −15 to −10 degrees relative to a perpendicular axis 26b of the backside substrate 18, thereby illuminating the left side of FIG. 1 and illuminating a corresponding subregion of the eye box region 19 as shown in FIGS. 3 and 4 below. The second VCSEL subarray 14b belongs to Zone 2, emitting the infrared light to the second lenslet 20b, which has a radius of curvature or segmentation angle that points a second illumination cone 22b of the emitted light in a second direction 26b which is +10 to +15 degrees relative to the perpendicular axis 26c, or second direction of the backside substrate 18, thereby illuminating the right side of FIG. 1 and illuminating a corresponding subregion of the eye box region 19 as shown in FIGS. 3 and 4 below. The third VCSEL subarray 14c belongs to Zone 3, emitting the infrared light to the third lenslet 20c, which has a radius of curvature or segmentation angle that directs a third illumination cone 22c of the emitted light perpendicularly to the surface of the backside substrate 18 along the perpendicular axis 26c, or third direction of the backside substrate 18, thereby illuminating the central portion of FIG. 1 and illuminating a corresponding subregion of the eye box region 19 as shown in FIGS. 3 and 4 below.

There may be any number of VCSEL subarrays 14a-c in the VCSEL array 12, including three as depicted in FIG. 1. However, it will be appreciated that increasing the number of VCSEL subarrays 14a-c in the VCSEL array 12 may increase prediction or modeling accuracy with respect to predicting the most appropriate areas of the corneal surface to illuminate on the eye of the user. Although not depicted, it will also be appreciated that one or more eye-tracking sensors, such as infrared cameras, are positioned along the body of the optical device 10 facing the eye box so as to image eye glints resulting from the light emitted by the VCSEL subarrays 14a-c. Processing circuitry in the optical device, such as processor 102, is configured to compute gaze direction for the eyes based upon the detected glints.

In accordance with these zones, the illumination cones 22a-c are configured to be dynamically turned on or off to illuminate the iris, pupil, and cornea of the eye of the user in a targeted manner, thereby reducing power consumption and increasing energy efficiency. By dynamically turning on or off the illumination cones 22a-c, the flexibility of the tunable illumination angles of the illumination cones 22a-c is utilized to only illuminate light in the regions (e.g., on the planes) where the corneal surface of the user is located. In some example configurations, the radii of curvature and segmentation angles of the lenslets 20a-c may be adjusted and customized to accommodate specific users' unique eye structures with or without prescription lenses.

Figure 2:
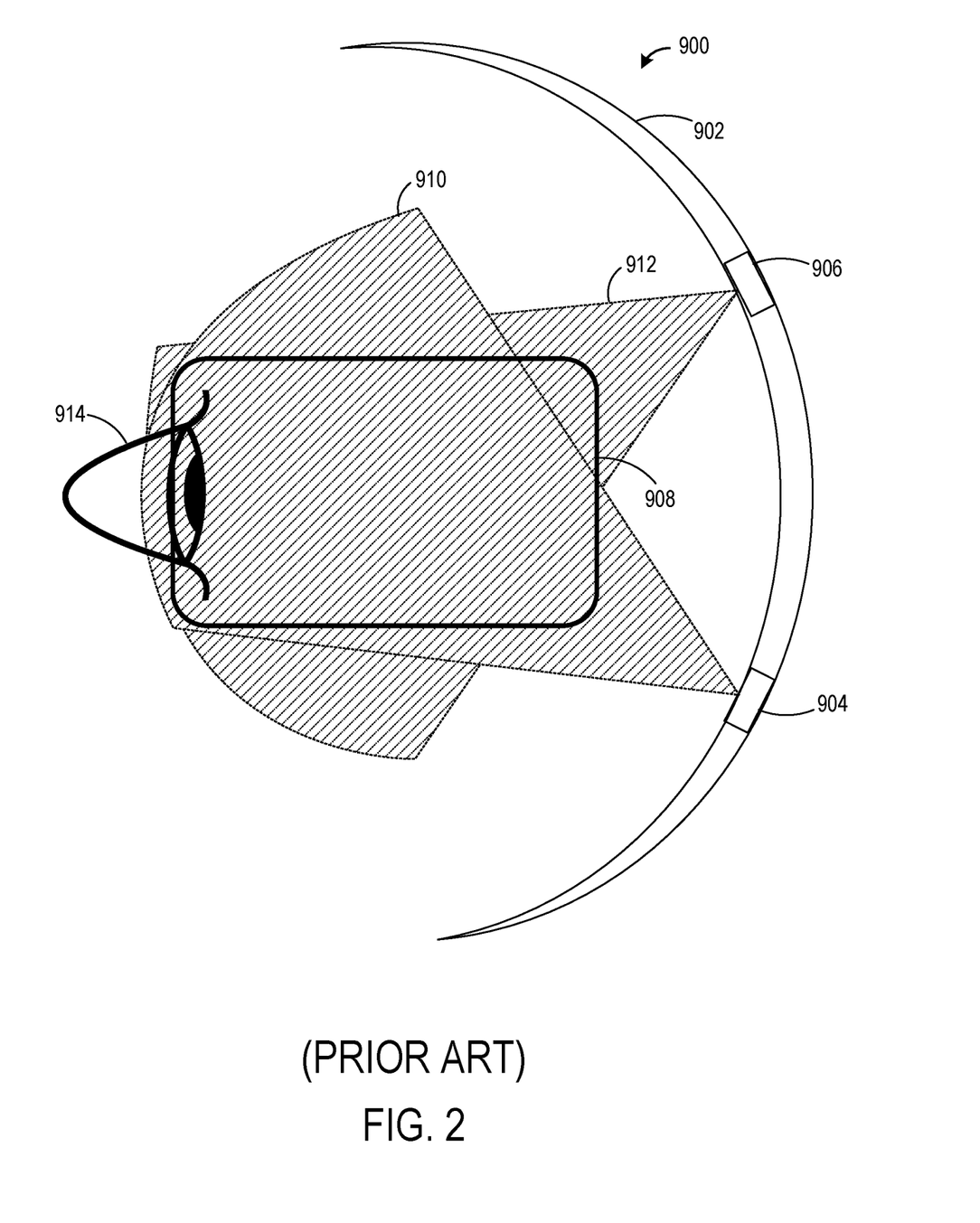
FIG. 2 illustrates a conventional head-mounted display which illuminates an entire volume of the eye box region immediately in front of the user's eye.

As shown in FIG. 2, a conventional head-mounted display 900 includes a display panel 902, a first LED light source 904, and a second LED light source 906. The volume of the eye box region 908 immediately in front of the eye of the user 914 is entirely illuminated by the first illumination cone 910 and second illumination cone 912 which are emitted by the first LED light source 904 and the second LED light source 906, respectively. While the widths of the first and second illumination cones 910, 912 ensure that the iris, pupil, and cornea can be adequately illuminated for a wide variety of users with different eye reliefs, this configuration also results in redundant illumination of many areas in the eye box region where the corneal surface of the user is not located, which reduces energy efficiency. Reduced energy efficiency can decrease battery life and increase undesirable heat generation.

Turning now to FIG. 3, an optical device 10 is provided that comprises a body 24 formed to have a concavity 17 within which an eye box region 19 is defined, and one or more VCSEL arrays 12, 13 arranged in the body 24 of the optical device 10. Here, the VCSEL array 12 is configured as a first VCSEL array, and a second VCSEL array 13 is positioned on or within the device body 24 at different locations relative to the eye of the first user 914. The second VCSEL array 13 being of substantially similar construction to the first VCSEL array 12 shown in FIG. 1. The one or more VCSEL arrays 12, 13 comprise a plurality of VCSEL subarrays 14a-f including a first VCSEL subarray 14a and a second VCSEL subarray 14b, the first and second VCSEL subarrays 14a, 14b being independently addressable. By independently addressing these subarrays with power, the subarrays can be controlled to selectively illuminate only a portion of the eye box 19.

The optical device 10 may be embodied as a head-mounted display device, smartphone, laptop, or other battery-powered devices, for example. In the example of FIG. 3, the first VCSEL array 12 comprises a first VCSEL subarray 14a, a second VCSEL subarray 14b, and a third VCSEL subarray 14c which are respectively aligned to the first lenslet 20a, the second lenslet 20b, and the third lenslet 20c. The second VCSEL array 13 comprises a fourth VCSEL subarray 14d, a fifth VCSEL subarray 14e, and a sixth VCSEL subarray 14f which are respectively aligned to a fourth lenslet 20d, a fifth lenslet 20e, and a sixth lenslet 20f. In one example, the device body 24 of the optical device 10 is a glass body, and the one or more VCSEL arrays 12, 13 are embedded within the glass body 24 of the optical device 10. By compactly integrating the one or more VCSEL arrays 12, 13 into the glass body 24 for in-field illumination, gaze accuracy may be increased in eye tracking systems.

There may be any number of VCSEL arrays 12, 13 in the optical device 10, including two as depicted in FIG. 3. However, it will be appreciated that increasing the number of VCSEL arrays 12, 13 in the optical device 10 may increase prediction or modeling accuracy with respect to predicting the most appropriate areas of the corneal surface to illuminate on the eye of the user.

The first VCSEL array 12 and the second VCSEL array 13 are coupled to a computing device 100 including a processor 102, volatile memory 104, an input/output module 106, and non-volatile memory 108 storing an illumination control program 110 and a user settings database 112. A bus 114 may operatively couple the processor 102, the volatile memory 104, and the input/output module 106 to the non-volatile memory 108. The optical device 10 may further include a battery 30 configured to power the processor 102 and the one or more VCSEL arrays 12, 13. The processor 102 is configured to control the independently addressable first and second VCSEL subarrays 14a, 14b in a power saving mode to power the first VCSEL subarray 14a and not the second VCSEL subarray 14b to illuminate only a first subregion 21 of the eye box region 19 (as shown in FIG. 3), or to power the second VCSEL subarray 14b and not the first VCSEL subarray 14a to only illuminate a second subregion 23 of the eye box region 19 (as shown in FIG. 4). In FIGS. 3 and 4 a third subregion 25 is unilluminated. The first subregion 21 and the second subregion 23 are smaller than the eye box region 19 and are smaller than a union of the first subregion 21 and the second subregion 23. The first subregion 21 may overlap the second subregion 23, but they are not coextensive, that is, they cover different respective areas (as viewed from above, volumes in practice) within the three-dimensional eye box 19. Of course, while a first and second subregion are illustrated, it will be appreciated that multiple subregions may be defined for illumination, for finer gradation in customizing the illumination patterns of the optical device 10.

The processor 102 is configured to store the illumination control program 110 and the user settings database 112 in non-volatile memory 108 that retains instructions stored data even in the absence of externally applied power, such as FLASH memory, a hard disk, read only memory (ROM), electrically erasable programmable memory (EEPROM), etc. The instructions include one or more programs, including the illumination control program 110, the user settings database 112, and data used by such programs sufficient to perform the operations described herein. In response to execution by the processor 102, the instructions cause the processor 102 to execute the illumination control program 110 and control the VCSEL arrays 12, 13 of the optical device 10 in accordance with the user settings 112a-c stored in the user settings database 112. In this example, the user settings database 112 includes first user settings 112a of a first user, second user settings 112b of a second user, and third user settings 112c of a third user.

The processor 102 is a microprocessor with processing circuitry that includes one or more of a central processing unit (CPU), a graphical processing unit (GPU), an application specific integrated circuit (ASIC), a system on chip (SOC), a field-programmable gate array (FPGA), a logic circuit, or other suitable type of microprocessor configured to perform the functions recited herein. Volatile memory 104 can include physical devices such as random access memory (RAM), static random access memory (SRAM), dynamic random access memory (DRAM), etc., which temporarily stores data only for so long as power is applied during execution of programs. Non-volatile memory 108 can include physical devices that are removable and/or built in, such as optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology.

In use, the processor 102 can determine a first user 914 of the optical device 10 is using the device, and can determine first user settings 112a corresponding to the first user 914, including a combination of the one or more VCSEL subarrays 14a-f corresponding to the first user 914, and can turn on or activate the combination of the one or more VCSEL subarrays 14a-f corresponding to the first user 914. Alternatively, the processor 102 can determine the combination corresponding to the first user 914 based on the first user settings 112a retrieved from the user settings database 112. For example, the processor 102 may determine the combination corresponding to the first user 914 based on an estimated distance between the corneal surface and the device body 24 which is included in the first user settings 112a. The VCSEL subarrays which are not included in the determined combination corresponding to the first user 914 are turned off. In this example, the determined combination is the first VCSEL subarray 14a of the first VCSEL array 12 and the sixth VCSEL subarray 14f of the second VCSEL array 13. The first illumination cone 22a of the first VCSEL subarray 14a and the sixth illumination cone 22f of the sixth VCSEL subarray 14f overlap at a distance from the device body 24 which corresponds to the planes where the corneal surface of the first user 914 is located. Therefore, the processor 102 controls the first VCSEL array 12 in a power saving mode to power or activate the independently addressable first VCSEL subarray 14a and not the second VCSEL subarray 14b, and further controls the second VCSEL array 13 to power or activate the independently addressable sixth VCSEL subarray 14f and not the fourth VCSEL subarray 14d, so as to illuminate only the first subregion 21 of the eye box region 19. The processor 102 may also control the VCSEL array 12 to turn off or deactivate the second and third VCSEL subarrays 14b, 14c, and further control the second VCSEL array 13 to turn off or deactivate the fourth and fifth VCSEL subarrays 14d, 14e. Accordingly, the corneal surface of the first user 914 may be adequately illuminated by the optical device 10 without illuminating an entire eye box region 19 immediately in front of the eye of the first user 914.

To determine the first user settings 112a corresponding to the first user 914, the processor 102 may retrieve the first user settings 112a from the user settings database 112, or estimate the distance of a corneal surface of the first user 914 from the device body 24 of the optical device 10 using a proximity sensor 28 during a calibration process, for example. Then the processor 102 may determine a combination of the one or more VCSEL subarrays 14 which corresponds to the estimated distance, which may involve calculating a combination of illumination cones 22a-f of the plurality of lenslets 20a-f which overlap at the estimated distance. In this example, the first illumination cone 22a of the first VCSEL subarray 14a and the sixth illumination cone 22f of the sixth VCSEL subarray 14f are calculated to overlap at a distance from the device body 24 which corresponds to the planes where the corneal surface of the first user 914 is located. The determined combinations for the first user 914 are stored as first user settings 112a in the user settings database 112, so that calibration data about the eye reliefs of each user may be stored for later retrieval.

Referring to FIG. 4, a second user 916 wears the optical device 10 of FIG. 3, and the optical device 10 adjusts the illumination of the corneal surface of the second user 916 accordingly. Like parts in this example are numbered similarly to the example of FIG. 3 and share their functions, and will not be redescribed except as below for the sake of brevity. In this example, the eye relief of the second user 916 is such that the distance of the corneal surface of the second user 916 from the device body 24 is shorter than that of the first user 914.

To determine the second user settings 112b corresponding to the second user 916, the processor 102 determines second user settings 112b corresponding to the second user 916, including a combination of the one or more VCSEL subarrays 14a-f corresponding to the second user 916, and turns on or activates the determined combination of the one or more VCSEL subarrays 14a-f corresponding to the second user 916. Alternatively, the processor 102 may determine the combination corresponding to the second user 914 based on the second user settings 112b retrieved from the user settings database 112. The VCSEL subarrays which are not included in the determined combination corresponding to the second user 916 are turned off. In this example, the second illumination cone 22b of the second VCSEL subarray 14b and the fourth illumination cone 22d of the fourth VCSEL subarray 14d overlap at a distance from the device body 24 which corresponds to the planes where the corneal surface of the second user 916 is located. Therefore, the processor 102 controls the first VCSEL array 12 in a power saving mode to power or activate the independently addressable second VCSEL subarray 14b and not the first VCSEL subarray 14a, and further controls the second VCSEL array 13 to power or activate the independently addressable fourth VCSEL subarray 14d and not the sixth VCSEL subarray 14f, so as to illuminate only the second subregion 23 of the eye box region 19. The processor 102 may also control the VCSEL array 12 to turn off or deactivate the first and third VCSEL subarrays 14a, 14c, and further control the second VCSEL array 13 to turn off or deactivate the fifth and sixth VCSEL subarrays 14e, 14f. Accordingly, the processor controls the first VCSEL array 12 and the second VCSEL array 13 to dynamically adjust illumination angles of the illumination cones 22a-f emitted by the VCSEL subarrays 14a-f of the optical device 10 in accordance with an eye relief of an individual user, thereby increasing energy efficiency and reducing power consumption. While illustrated in two dimensions in FIGS. 3 and 4 for ease of understanding, it will be appreciated that the first and second subregions are three-dimensional in practice.

Figure 5:
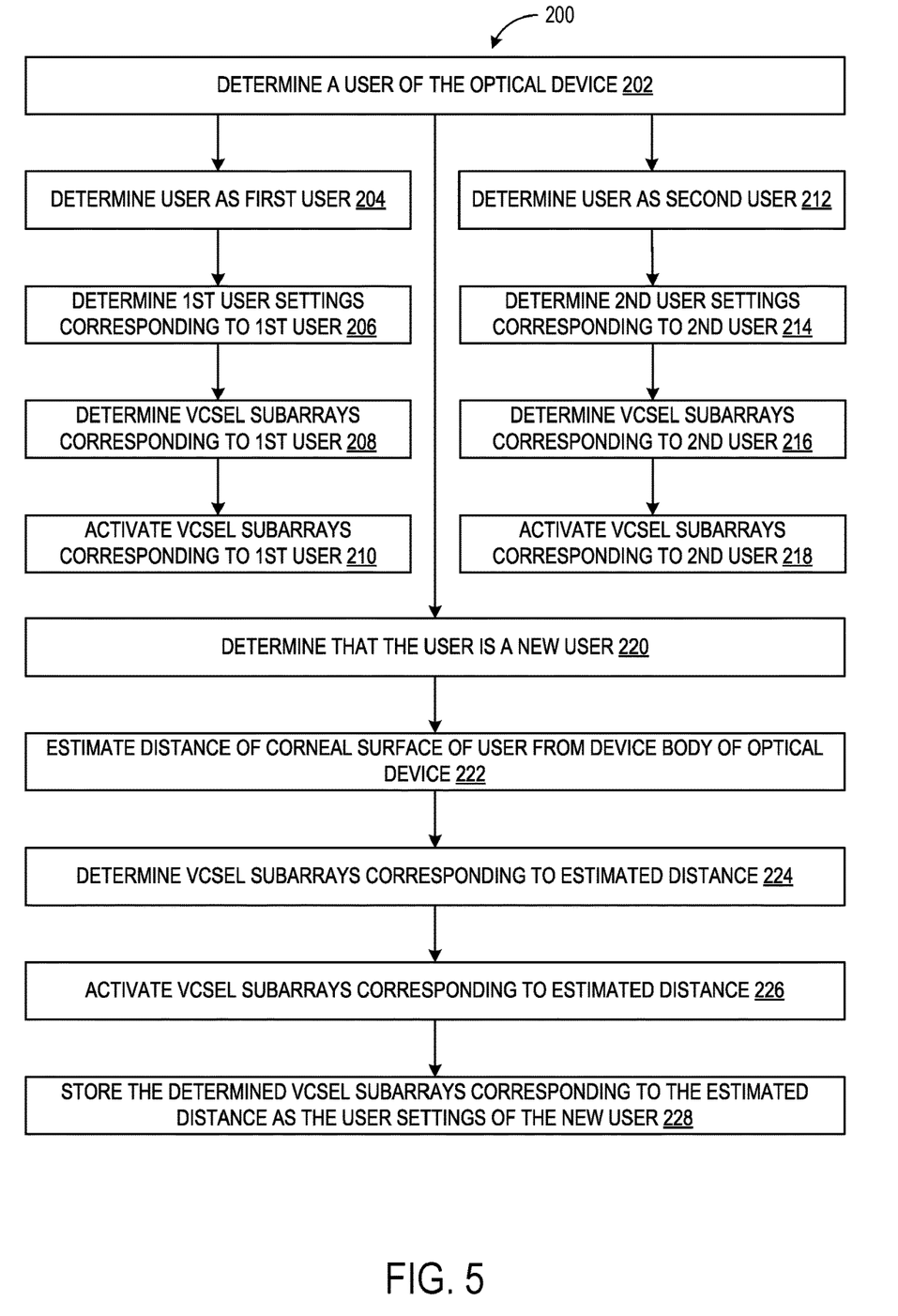
FIG. 5 depicts a flowchart illustrating an example method according to one example of the present disclosure.

FIG. 5 illustrates a flowchart of a computerized method 200 to dynamically adjust illumination angles of the illumination cones emitted by the VCSEL subarrays of the optical device in accordance with an eye relief of an individual user. The following description of computerized method 200 is provided with reference to the software and hardware components described above and shown in FIGS. 1-4.

Method 200 includes step 202 to determine a user of the optical device. At step 204, it is determined that the user is a first user. At step 206, first user settings corresponding to the first user are determined. The first user settings may be retrieved from a user settings database or estimated using a proximity sensor. At step 208, a combination of one or more VCSEL subarrays corresponding to the first user is determined, which may be directly retrieved from the first user settings or calculated based on the first user settings. At step 210, the determined combination of the one or more VCSEL subarrays corresponding to the first user are activated, and the VCSEL subarrays among the one or more VCSEL subarrays which are not included in the determined combination of the one or more VCSEL subarrays are turned off or deactivated.

At step 212, it is determined that the user is a second user. At step 214, second user settings corresponding to the second user are determined. The second user settings may be retrieved from a user settings database or estimated using a proximity sensor. At step 216, a combination of the one or more VCSEL subarrays corresponding to the second user is determined, which may be directly retrieved from the second user settings or calculated based on the second user settings. At step 218, the determined combination of the one or more VCSEL subarrays corresponding to the second user are activated, and the VCSEL subarrays among the one or more VCSEL subarrays which are not included in the determined combination of the one or more VCSEL subarrays are turned off or deactivated.

At step 220, it is determined that the user is a new user with no user settings stored in the user settings database yet. At step 222, a distance of the corneal surface of the new user from the device body of the optical device is estimated. The distance estimation may be performed using a proximity sensor, for example. At step 224, a combination of the one or more VCSEL subarrays which corresponds to the estimated distance is determined. At step 226, the determined combination of the one or more VCSEL subarrays corresponding to the estimated distance is activated, and the VCSEL subarrays among the one or more VCSEL subarrays which are not included in the determined combination of the one or more VCSEL subarrays are turned off or deactivated. At step 228, the determined combination of the one or more VCSEL subarrays is stored as the user settings corresponding to the new user.

The above-described device and method increase safety and energy efficiency. The monolithic integration of the microlens array and the one or more VCSEL subarrays on the backside substrate reduces the risk of beam-shaping optical elements from falling off the device and exposing the naked eye to damaging lasers. The VCSEL arrays are controlled to dynamically adjust illumination angles of VCSEL subarrays of the optical device in accordance with an eye relief of an individual user, thereby increasing energy efficiency and reducing power consumption while still providing adequate illumination to the corneal surface of the eye for potential applications including eye tracking systems.

Figure 6:
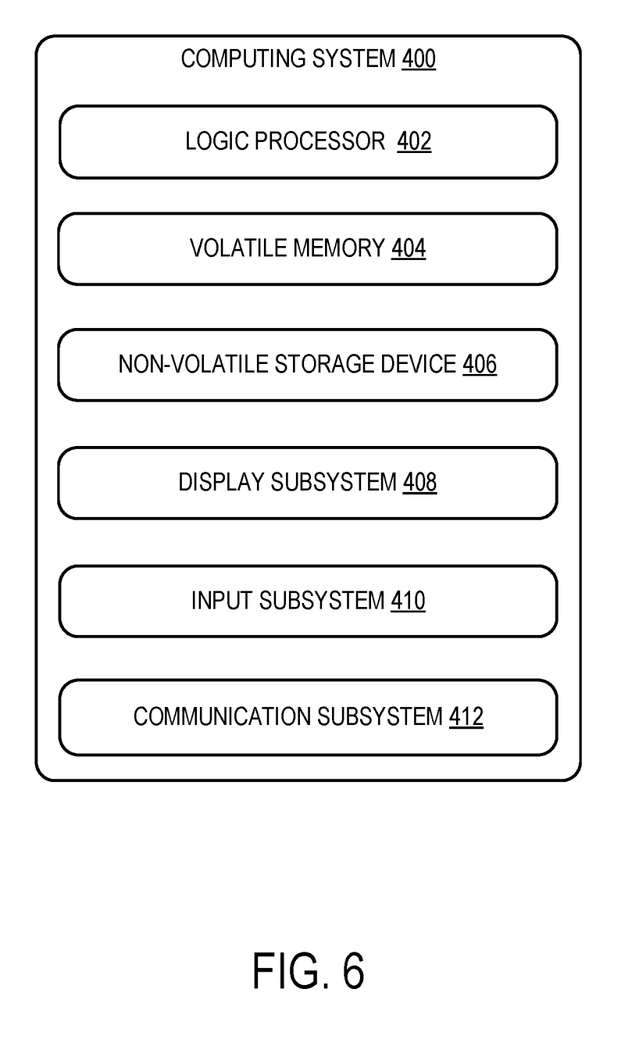
FIG. 6 depicts a block diagram of an example computing system that may be used to implement the computing device of FIGS. 3 and 4.

FIG. 6 schematically shows a non-limiting embodiment of a computing system 400 that can enact one or more of the methods and processes described above. Computing system 400 is shown in simplified form. Computing system 400 may embody the computing device 100 described above and illustrated in FIGS. 3 and 4. Computing system 400 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 400 includes a logic processor 402, volatile memory 404, and a non-volatile storage device 406. Computing system 400 may optionally include a display subsystem 408, input subsystem 410, communication subsystem 412, and/or other components not shown in FIG. 6.

Logic processor 402 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 402 may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 402 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 406 includes one or more physical devices configured to hold instructions executable by the logic processors to implement the methods and processes described herein. When such methods and processes are implemented, the state of non-volatile storage device 406 may be transformed—e.g., to hold different data.

Non-volatile storage device 406 may include physical devices that are removable and/or built in. Non-volatile storage device 406 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 406 may include nonvolatile, dynamic, static, read/write, read-only, sequential-access, location-addressable, file-addressable, and/or content-addressable devices. It will be appreciated that non-volatile storage device 406 is configured to hold instructions even when power is cut to the non-volatile storage device 406.

Volatile memory 404 may include physical devices that include random access memory. Volatile memory 404 is typically utilized by logic processor 402 to temporarily store information during processing of software instructions. It will be appreciated that volatile memory 404 typically does not continue to store instructions when power is cut to the volatile memory 404.

Aspects of logic processor 402, volatile memory 404, and non-volatile storage device 406 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 400 typically implemented in software by a processor to perform a particular function using portions of volatile memory, which function involves transformative processing that specially configures the processor to perform the function. Thus, a module, program, or engine may be instantiated via logic processor 402 executing instructions held by non-volatile storage device 406, using portions of volatile memory 404. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "cprogram," and "engine" may encompass individual or groups of executable files, data files, libraries, drivers, scripts, database records, etc.

When included, display subsystem 408 may be used to present a visual representation of data held by non-volatile storage device 406. The visual representation may take the form of a graphical user interface (GUI). As the herein described methods and processes change the data held by the non-volatile storage device, and thus transform the state of the non-volatile storage device, the state of display subsystem 408 may likewise be transformed to visually represent changes in the underlying data. Display subsystem 408 may include one or more display devices utilizing virtually any type of technology. Such display devices may be combined with logic processor 402, volatile memory 404, and/or non-volatile storage device 406 in a shared enclosure, or such display devices may be peripheral display devices.

When included, input subsystem 410 may comprise or interface with one or more user-input devices such as a keyboard, mouse, touch screen.

When included, communication subsystem 412 may be configured to communicatively couple various computing devices described herein with each other, and with other devices. Communication subsystem 412 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 400 to send and/or receive messages to and/or from other devices via a network such as the Internet.

The following paragraphs provide additional support for the claims of the subject application. One aspect provides an optical device comprising a body formed to have a concavity within which an eye box region is defined, and one or more vertical cavity surface emitting laser (VCSEL) arrays arranged in the body of the optical device, where the one or more VCSEL arrays comprise a plurality of VCSEL subarrays including a first VCSEL subarray and a second VCSEL subarray, the first and second VCSEL subarrays being independently addressable, and processing circuitry configured to control the independently addressable first and second VCSEL subarrays in a power saving mode to power the first VCSEL subarray and not the second VCSEL subarray to illuminate only a first subregion of the eye box region, or to power the second VCSEL subarray and not the first VCSEL subarray to only illuminate a second subregion of the eye box region. In this aspect, additionally or alternatively, the first subregion and the second subregion are smaller than the eye box region and are smaller than a union of the first subregion and the second subregion. In this aspect, additionally or alternatively, the optical device further includes a battery configured to power the processing circuitry and the one or more VCSEL arrays, and the plurality of VCSEL subarrays are configured to emit infrared light when powered. In this aspect, additionally or alternatively, each of the one or more VCSEL arrays comprises a microlens array including a plurality of lenslets, and in each VCSEL array, each of the plurality of lenslets directs an illumination cone of an emitted light in a different direction. In this aspect, additionally or alternatively, each of the one or more VCSEL arrays comprises a microlens array including a plurality of lenslets, and in each VCSEL array, each of the plurality of lenslets has a different radius of curvature or segmentation angle. In this aspect, additionally or alternatively, each of the one or more VCSEL arrays comprises a backside substrate, and a microlens array etched on a first surface of the backside substrate. In this aspect, additionally or alternatively, the plurality of VCSEL subarrays are arranged on a second surface of the backside substrate opposite the first surface. In this aspect, additionally or alternatively, the optical device is a head-mounted device, the body of the optical device is a glass body, and the plurality of VCSEL subarrays are embedded within the glass body. In this aspect, additionally or alternatively, the optical device further comprises non-volatile memory storing instructions executed by the processing circuitry to determine a user of the optical device, determine user settings corresponding to the user, based on the user settings, determine a combination of the plurality of VCSEL subarrays corresponding to the user, and activate the determined combination of the plurality of VCSEL subarrays corresponding to the user. In this aspect, additionally or alternatively, the optical device further comprises non-volatile memory storing instructions executed by the processing circuitry to estimate a distance of a corneal surface of a user from the body of the optical device, determine a combination of the plurality of VCSEL subarrays which corresponds to the estimated distance, and activate the determined combination of the plurality of VCSEL subarrays corresponding to the estimated distance. Another aspect provides an addressable vertical cavity surface emitting laser (VCSEL) array comprising a microlens array including a plurality of lenslets, a backside substrate, and a plurality of VCSEL subarrays respectively aligned with the plurality of lenslets of the microlens array, wherein the microlens array and the plurality of VCSEL subarrays are monolithically integrated on the backside substrate. In this aspect, additionally or alternatively, the plurality of lenslets are pseudo-randomized in shape, size, and curvature. In this aspect, additionally or alternatively, each of the plurality of lenslets directs an illumination cone of an emitted light in a different direction. In this aspect, additionally or alternatively, a diffuser is not included or combined with the addressable VCSEL array. In this aspect, additionally or alternatively, the microlens array is etched on a first surface of the backside substrate. In this aspect, additionally or alternatively, the plurality of VCSEL subarrays are arranged on a second surface of the backside substrate opposite the first surface.

Another aspect provides a method for dynamically adjusting an illumination angle of an illumination light source of an optical device in accordance with an eye relief of a user, the method comprising steps to determine the user of the optical device, determine user settings corresponding to the user, based on the user settings, determine a combination of a plurality of vertical cavity surface emitting laser (VCSEL) subarrays of the optical device corresponding to the user, and activate the determined combination of the plurality of VCSEL subarrays corresponding to the user. In this aspect, additionally or alternatively, the method further comprises steps to estimate a distance of a corneal surface of the user from a body of the optical device, determine a combination of the plurality of VCSEL subarrays which corresponds to the estimated distance, and activate the determined combination of the plurality of VCSEL subarrays corresponding to the estimated distance. In this aspect, additionally or alternatively, the method further comprises storing the determined combination of the plurality of VCSEL subarrays as the user settings corresponding to the user. In this aspect, additionally or alternatively, the plurality of VCSEL subarrays is respectively aligned to a plurality of lenslets, each of the plurality of lenslets directs an illumination cone of an emitted light in a different direction, and the determination of the combination of the plurality of VCSEL subarrays includes calculating a combination of illumination cones of the plurality of lenslets which overlap at the estimated distance.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

It will be appreciated that "and/or" as used herein refers to the logical disjunction operation, and thus A and/or B has the following truth table.

| A | B | A and/or B |
|---|---|---|
| T | T | T |
| T | F | T |
| F | T | T |
| F | F | F |

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An optical device comprising:
a body formed to have a concavity within which an eye box region is defined; and
one or more vertical cavity surface emitting laser (VCSEL) arrays arranged in the body of the optical device, wherein the one or more VCSEL arrays comprise a plurality of VCSEL subarrays including a first VCSEL subarray and a second VCSEL subarray, the first and second VCSEL subarrays being independently addressable; and
processing circuitry configured to control the independently addressable first and second VCSEL subarrays in a power saving mode to power the first VCSEL subarray and not the second VCSEL subarray to illuminate only a first subregion of the eye box region, or to power the second VCSEL subarray and not the first VCSEL subarray to only illuminate a second subregion of the eye box region, wherein
the first subregion and the second subregion are smaller than the eye box region and are smaller than a union of the first subregion and the second subregion.

2. The optical device of claim 1, wherein
the optical device further includes a battery configured to power the processing circuitry and the one or more VCSEL arrays; and
the plurality of VCSEL subarrays are configured to emit infrared light when powered.

3. The optical device of claim 1, wherein
each of the one or more VCSEL arrays comprises a microlens array including a plurality of lenslets; and
in each VCSEL array, each of the plurality of lenslets directs an illumination cone of an emitted light in a different direction.

4. The optical device of claim 1, wherein
each of the one or more VCSEL arrays comprises a microlens array including a plurality of lenslets; and
in each VCSEL array, each of the plurality of lenslets has a different radius of curvature or segmentation angle.

5. The optical device of claim 1, wherein each of the one or more VCSEL arrays comprises:
a backside substrate; and
a microlens array etched on a first surface of the backside substrate.

6. The optical device of claim 5, wherein the plurality of VCSEL subarrays are arranged on a second surface of the backside substrate opposite the first surface.

7. The optical device of claim 1, wherein
the optical device is a head-mounted device;
the body of the optical device is a glass body; and
the plurality of VCSEL subarrays are embedded within the glass body.

8. The optical device of claim 1, further comprising:
non-volatile memory storing instructions executed by the processing circuitry to:
determine a user of the optical device;
determine user settings corresponding to the user;
based on the user settings, determine a combination of the plurality of VCSEL subarrays corresponding to the user; and
activate the determined combination of the plurality of VCSEL subarrays corresponding to the user.

9. The optical device of claim 1, further comprising:
non-volatile memory storing instructions executed by the processing circuitry to:
estimate a distance of a corneal surface of a user from the body of the optical device;
determine a combination of the plurality of VCSEL subarrays which corresponds to the estimated distance; and
activate the determined combination of the plurality of VCSEL subarrays corresponding to the estimated distance.

10. An optical device comprising:
a body formed to have a concavity within which an eye box region is defined;
processing circuitry; and
an addressable vertical cavity surface emitting laser (VCSEL) array arranged in the body of the optical device, the VCSEL array comprising:
a microlens array including a plurality of lenslets;
a backside substrate; and
a plurality of VCSEL subarrays respectively aligned with the plurality of lenslets of the microlens array, wherein
the microlens array and the plurality of VCSEL subarrays are monolithically integrated on the backside substrate;
the plurality of VCSEL subarrays include a first VCSEL subarray and a second VCSEL subarray, the first and second VCSEL subarrays being independently addressable;
processing circuitry is configured to control the independently addressable first and second VCSEL subarrays in a power saving mode to power the first VCSEL subarray and not the second VCSEL subarray to illuminate only a first subregion of the eye box region, or to power the second VCSEL subarray and not the first VCSEL subarray to only illuminate a second subregion of the eye box region; and
the first subregion and the second subregion are smaller than the eye box region and are smaller than a union of the first subregion and the second subregion.

11. The optical device of claim 10, wherein the plurality of lenslets are pseudo-randomized in shape, size, and curvature.

12. The optical device of claim 10, wherein each of the plurality of lenslets directs an illumination cone of an emitted light in a different direction.

13. The optical device of claim 10, wherein a diffuser is not included or combined with the addressable VCSEL array.

14. The optical device of claim 10, wherein the microlens array is etched on a first surface of the backside substrate.

15. The optical device of claim 14, wherein the plurality of VCSEL subarrays are arranged on a second surface of the backside substrate opposite the first surface.

16. A method for dynamically adjusting an illumination angle of an illumination light source of an optical device in accordance with an eye relief of a user, the method comprising steps to:
determine the user of the optical device;
determine user settings corresponding to the user;
based on the user settings, determine a combination of a plurality of vertical cavity surface emitting laser (VCSEL) subarrays of the optical device corresponding to the eye relief of the user; and
activate the determined combination of the plurality of VCSEL subarrays corresponding to the eye relief of the user.

17. The method of claim 16, further comprising steps to:
estimate a distance of a corneal surface of the user from a body of the optical device;
determine a combination of the plurality of VCSEL subarrays which corresponds to the estimated distance; and
activate the determined combination of the plurality of VCSEL subarrays corresponding to the estimated distance.

18. The method of claim 17, further comprising:
storing the determined combination of the plurality of VCSEL subarrays as the user settings corresponding to the user.

19. The method of claim 1, wherein
the plurality of VCSEL subarrays is respectively aligned to a plurality of lenslets;
each of the plurality of lenslets directs an illumination cone of an emitted light in a different direction; and
the determination of the combination of the plurality of VCSEL subarrays includes calculating a combination of illumination cones of the plurality of lenslets which overlap at the estimated distance.

* * * * *